(12) United States Patent
Kuroda et al.

(10) Patent No.: US 6,690,002 B2
(45) Date of Patent: Feb. 10, 2004

(54) PHOTODETECTOR ARRAY AND OPTICAL COMMUNICATION MONITOR MODULE USING THE SAME

(75) Inventors: Yasunao Kuroda, Osaka (JP); Takashi Tagami, Osaka (JP); Kenichi Nakama, Osaka (JP)

(73) Assignee: Nippon Sheet Glass, Co., Ltd., Osaka (JP)

( * ) Notice: Subject to any disclaimer, the term of this patent is extended or adjusted under 35 U.S.C. 154(b) by 0 days.

(21) Appl. No.: 09/915,477

(22) Filed: Jul. 27, 2001

(65) Prior Publication Data

US 2002/0050557 A1 May 2, 2002

(30) Foreign Application Priority Data

Aug. 2, 2000 (JP) .................... P2000-234941

(51) Int. Cl.$^7$ .................................. H01J 40/14
(52) U.S. Cl. .................... 250/214 R; 250/237 R; 398/82
(58) Field of Search ................. 359/110, 109, 359/558, 563; 250/214 R, 208.1, 208.2, 208.6, 237 R, 237 G; 356/326–328; 398/82, 84, 87

(56) References Cited

U.S. PATENT DOCUMENTS

| | | | |
|---|---|---|---|
| 4,736,360 A | | 4/1988 | McMahon .................. 370/3 |
| 5,020,910 A | * | 6/1991 | Dunn et al. ................ 356/328 |
| 5,731,874 A | * | 3/1998 | Maluf ...................... 356/326 |
| 6,256,016 B1 | * | 7/2001 | Piot et al. ................. 250/208.2 |

FOREIGN PATENT DOCUMENTS

WO    WO99/46629    9/1999

* cited by examiner

*Primary Examiner*—Stephone B. Allen
(74) *Attorney, Agent, or Firm*—Whitham, Curtis & Christofferson, P.C.

(57) ABSTRACT

When a diffraction grating having a grating period of d and a diffraction order of m for an incident light having a wavelength interval $\Delta\lambda_i$ between i'th and (i+1)'th channels is used, an optical path length between the diffraction grating and the photodetector is represented by L and a mean output angle is represented by $\theta_o$, a pitch $p_i$ between the i'th and (i+1)'th photodetectors in the photodetector array satisfies the equation of $p_i = m\Delta\lambda_i L/d \cos\theta_o$.

4 Claims, 3 Drawing Sheets

PHOTODETECTOR ARRAY AND OPTICAL COMMUNICATION MONITOR MODULE USING THE SAME

BACKGROUND OF THE INVENTION

The present invention relates to an optical communication technique, and more particularly to an optical component for dense wavelength division multiplexing communication and a module.

In order to satisfy a requirement for increasing a communication capacity in optical communication, there is often employed a communication method using a wavelength division multiplexing technique capable of increasing a communication capacity by exactly utilizing an existing optical fiber cable. A division multiplexing method having a small multiplexed optical frequency interval of approximately 100 GHz is particularly referred to as dense wavelength division multiplexing (DWDM).

In order to separate a signal obtained by multiplexing the light having such a very small frequency (wavelength) interval, spectral elements such as a wavelength filter or a prism have conventionally been known and are not suitable for dividing a large number of optical beams having close wavelengths. Therefore, a system using an arrayed wave guide grating (AWG) has often been utilized.

However, since the AWG is sensitive to a change in a temperature and an advanced technique is required for fabricating a complicated optical wave guide grating, the AWG is generally expensive and is not suitable for the purpose of requiring a large number of elements.

On the other hand, a diffraction grating is a spectral element in which a fine concavo-convex structure is formed on a surface such as quartz or a silicon substrate. A diffraction light generated in the same structure interferes with each other and a light having a specific wavelength is emitted in a specific direction. For a technique for forming the concavo-convex structure, a photolithography technique to be used for a semiconductor can be utilized. Therefore, it is possible to form a structure with very high precision. Moreover, a replica can also be formed easily through a transfer technique by setting a formed concavo-convex structure to be a master. For this reason, it is apparent that the diffraction grating is an optical component suitable for mass production.

While a device referred to as a wavelength monitor (or a channel monitor) to be used for grasping the state of each channel in a multiplexed light signal is a basically spectral branching filter, a large number of spectral branching filters are incorporated and used in an apparatus, for example, they are utilized for controlling an optical fiber amplifier. The inventors have noted that the diffraction grating is a spectral element suitable for such a purpose and have disclosed, as a spectral branching module, a structure in which a diffraction grating 3 and a photodetector array 4 shown in FIG. 4 are combined (JP-W-WO99/46629). A light beam 10 having a wavelength multiplexed which is emitted from an optical fiber 1 is changed into a parallel light 11 through a collimator lens 2 and is incident on a diffraction grating 3. The light is divided through the diffraction grating 3 and is emitted at an output angle which is varied depending on a wavelength. An emitted light 12 passes through the collimator lens 2 again, thereby forming a focused beam spot group 13 on a photodetector array 4. Each photodetector 40 in the photodetector array 4 is provided in the position of the focused beam spot group 13 of a light having each wavelength (channel).

Assuming that a reflective diffraction grating has a diffraction order of m, a grating period of d and a used wavelength of $\lambda$, an angle formed by a normal on a surface having the diffraction grating formed thereon and an incident beam (an optical axis 5 of an optical fiber) is represented by $\theta_i$ and an angle formed by an emitted beam is represented by $\theta_o$, the following equation is satisfied.

$$\sin \theta_i + \sin \theta_o = m\lambda/d$$

When $\theta_i$ is constant and a wavelength is changed by $\Delta\lambda$, a change $\Delta x$ in the position of a light beam reaching a light receiving surface provided apart from the diffraction grating by a distance L is given by the following equation.

$$\Delta x = (Lm/(d \cdot \cos \theta_o)) \cdot \Delta\lambda$$

FIG. 4 shows the case of $\theta_i = \theta_o$ (littrow arrangement). The above equation can be generally established also in the case of $\theta_i \neq \theta_o$. Accordingly, if a wavelength interval is constant, a plurality of photodetectors are arranged at an interval so that the position and wavelength (each channel) of the photodetector can be caused to have one to one correspondence to each other.

A communication wavelength in DWDM is defined to be a frequency pitch every 100 GHz at a minimum by the standard of the International Telecommunication Union (ITU). An example (C band) is shown in the column of a first row from the left of Table 1. For this reason, even if a frequency f is defined at a constant interval based on the relationship of $\lambda = c/f$ (c is a light velocity), wavelength intervals are not equal to each other. In the case in which the diffraction grating is used as a spectral element, a position where the divided light beam reaches a light receiving surface is not provided at an interval (see a second row from the left in Table 1).

Moreover, in the case in which a part of channels in the defined frequencies are used, frequency intervals between all the channels do not need to be constant. In this case, a "jump" is caused in the position where the divided light beam might further reach the light receiving surface in addition to the reasons described above.

However, a conventional ordinary photodetector array has a constant pitch between the photodetectors. When such a photodetector is used for the wavelength division multiplexing signal, the photodetector cannot be caused to have one-to-one correspondence with each channel so that a signal for one channel is received by the adjacent photodetectors or some photodetector elements do not receive a signal. Therefore, there is a problem in that a corresponding relationship between the photoreceptor and the channel becomes complicated and more photodetectors than channels are required for signal separation between the channels. Moreover, there is also a problem in that the area of a photodetector chip is increased corresponding to the presence of the unused photodetector on a chip.

SUMMARY OF THE INVENTION

It is an object of the invention to provide a small-sized photodetector array having an excellent signal separation characteristic which solves the problems described above.

In order to attain the object, there is provided a photodetector array in which three or more photodetectors are arranged rectilinearly and an array pitch between the adjacent photodetectors is not constant through the whole array.

Moreover, there is provided an optical communication monitor module in which a diffraction grating having a grating period of d and a diffraction order of m for an incident light having a wavelength interval $\Delta\lambda_i$ between i'th and (i+1)'th channels is used, an optical path length between the diffraction grating and the photodetector is represented by L and a mean output angle is represented by $\theta_o$, a pitch P, between the i'th and (i+1)'th photodetectors in the photodetector array satisfies the following equation:

$$p_i = m\Delta\lambda_i L/d \cos\theta_o.$$

More specifically, the size of a photodetector array chip can be substantially reduced by changing an array pitch between the photodetectors according to the position of incidence of a light on the photodetector array.

The present disclosure relates to the subject matter contained in Japanese patent application No. 2000-234941 (filed on Aug. 2, 2000), which is expressly incorporated herein by reference in its entirety.

DETAILED DESCRIPTION OF PREFERRED EMBODIMENTS

Figure 1:
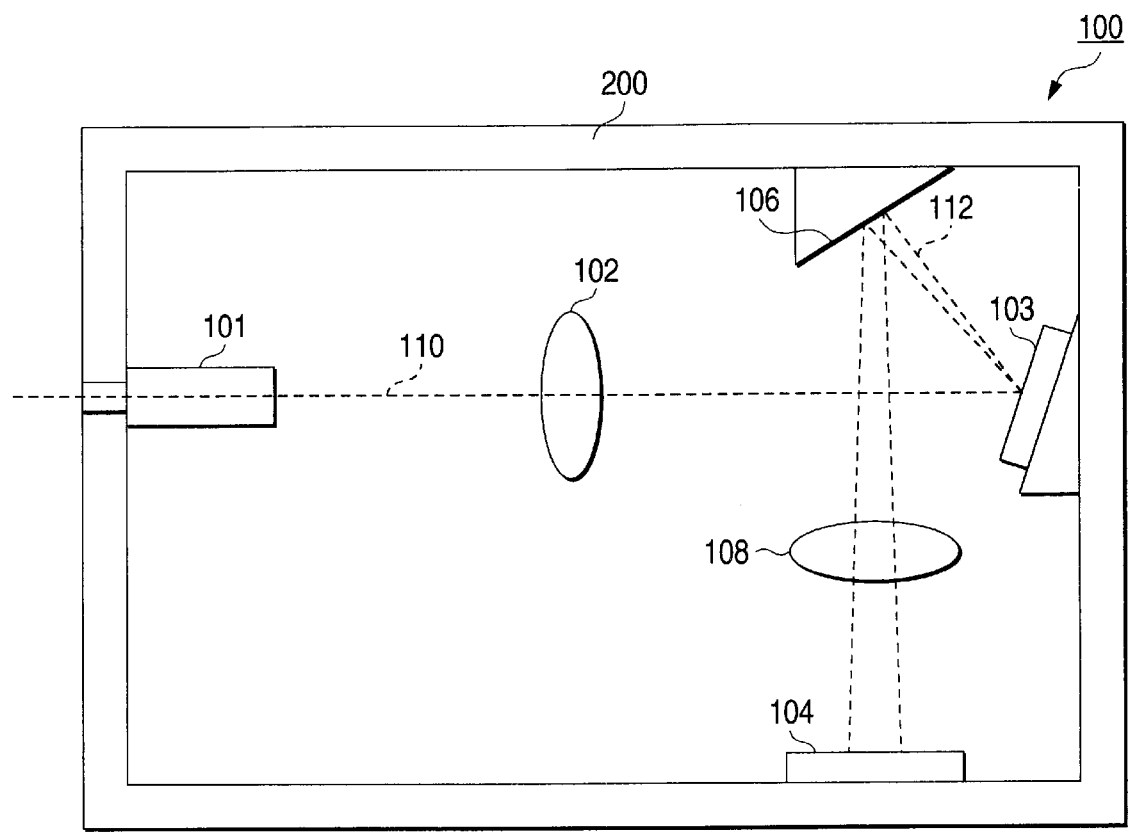
FIG. 1 is a conceptual view showing an optical communication monitor module according to the invention.

FIG. 1 is a schematic view showing an optical communication monitor module 100 according to the invention. An incident light 110 having a wavelength multiplexed is led into a housing 200 of the module through an optical fiber 101 and is shaped into a beam having a predetermined diameter through a collimator lens 102. Next, a position is adjusted such that a light is incident on a diffraction grating 103 at a predetermined angle. Consequently, an output angle is changed slightly and gradually for each channel having a wavelength varied so that a light 112 is emitted. The light 112 is caused to pass through a return collective lens 108 by means of a mirror 106. Consequently, a beam is collected on a photodetector array 104. By setting each element interval of the photodetector array 104 to be determined by the following equation, it is possible to form a channel monitor having a high degree of separation.

More specifically, when a diffraction grating having a grating period of d and a diffraction order of m for an incident light having a wavelength interval $\Delta\lambda_i$ between i'th and (i+1)'th channels is used, an optical path length between the diffraction grating and the photodetector is represented by L and an output angle in a central wavelength is represented by $\theta_o$, a pitch (a photodetector pitch) $p_i$ between the i'th and (i+1)'th photodetectors in the photodetector array satisfies the following equation:

$$p_i = m\Delta\lambda_i L/d \cos\theta_o.$$

A specific example of design of a channel monitor will be described below. In the following embodiments, description will be given to the case in which an incidence angle and an output angle for a diffraction grating are varied. The invention is also applicable to a littrow arrangement.

[First Embodiment]

A wavelength of 1.55 μm band is used. A central wavelength is defined to be 1552.52 nm. A channel pitch is set to 100 GHz according to the standard of a C band of the ITU and 16 continuous channels are used. An optical path length L is determined such that an interval in the photodetector array is 50 μm in the vicinity of the central wavelength. A diffraction order of the diffraction grating is set to 25 and a grating period is determined to be 24.7 μm such that an incidence angle is 71.5 degrees and an output angle is 38.5 degrees with a central wavelength. At this time, an interval between the photodetectors (i.e. a photodetector pitch) corresponding to an output angle from the diffraction grating of a light having each wavelength (channel) is shown in the Table 1. L is 48 mm. The interval between the photodetectors (the photodetector pitch) makes a difference of 1.4 μm (2.8%) on both ends (i.e. between the maximum and minimal values).

Figure 2:
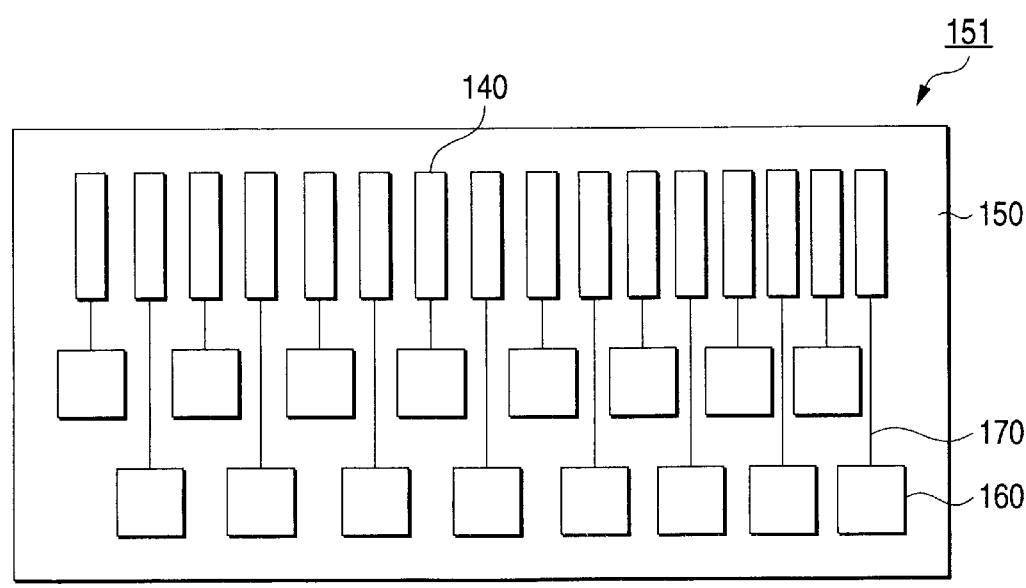
FIG. 2 is a plan view showing an embodiment of a photodetector array chip according to the invention.

If a photomask of the photodetector array having the photodetectors provided at the interval (the photodetector pitch) shown in the Table 1 is designed, a mesa photodetector array comprising InGaAsP/InP can further be fabricated in a conventional process. FIG. 2 is a plan view showing a photodetector array chip 151 thus fabricated. FIG. 2 is a schematic view in which the size, interval (pitch) and the like of the photodetector are not accurate. 16 photodetectors 140 are formed on an InP substrate 150, and are connected to bonding pads 160 through metallic wirings 170, respectively. The bonding pad usually requires a size of 80 to 100 μm square. In the embodiment, the interval between the photodetectors 140 (i.e. the photodetector pitch) is approximately 50 μm which is smaller than that between the bonding pads 160. Accordingly, the bonding pads 160 are arranged in two rows on one of sides of the photodetectors 140. The way of the arrangement is not restricted thereto but the bonding pads 160 may be arranged as two rows each being located at a respective one of sides of the photodetectors 140, for example.

By selection of a central wavelength and the number of channels, for example, various channel monitors such as 8-channel or 32-channel can be constituted.

In this embodiment, the photodetectors 140 are arrayed to accurately meet the photodetector pitch shown in the table 1. However, in this embodiment, a difference in the interval between the photodetectors (i.e. in the photodetector pitch) due to the selected wavelengths falls within 2.8%, and therefore problems rarely arise on actual working conditions even if all the photodetectors 140 are arrayed in an equal pitch. In addition, if the difference in the interval between the photodetectors due to the selected wavelength is great, a width of the photodetector may also be varied according to a ratio of the interval (the pitch) between the photodetectors.

[Second Embodiment]

Figure 3:
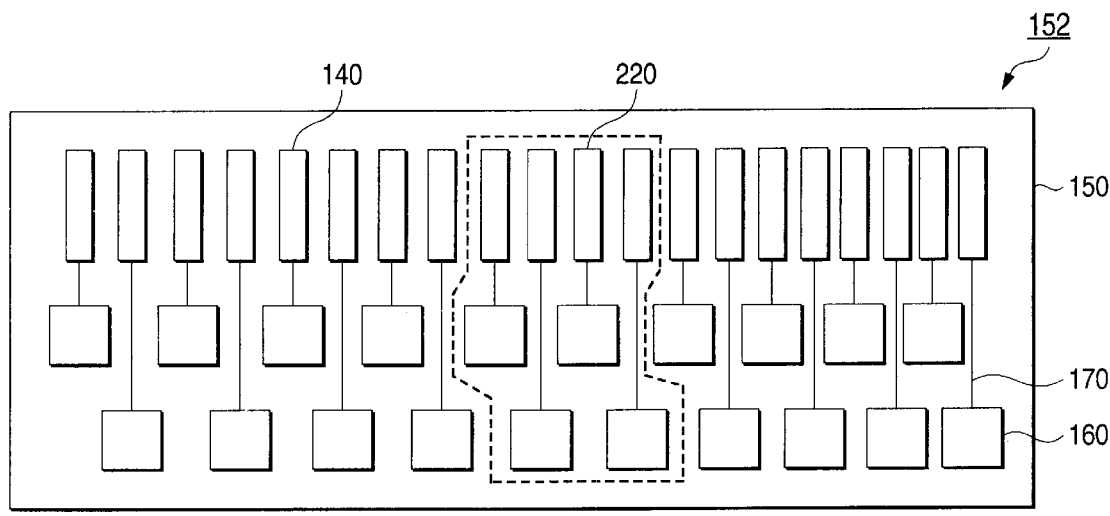
FIG. 3 is a plan view showing another embodiment of the photodetector array chip according to the invention.
Figure 3:
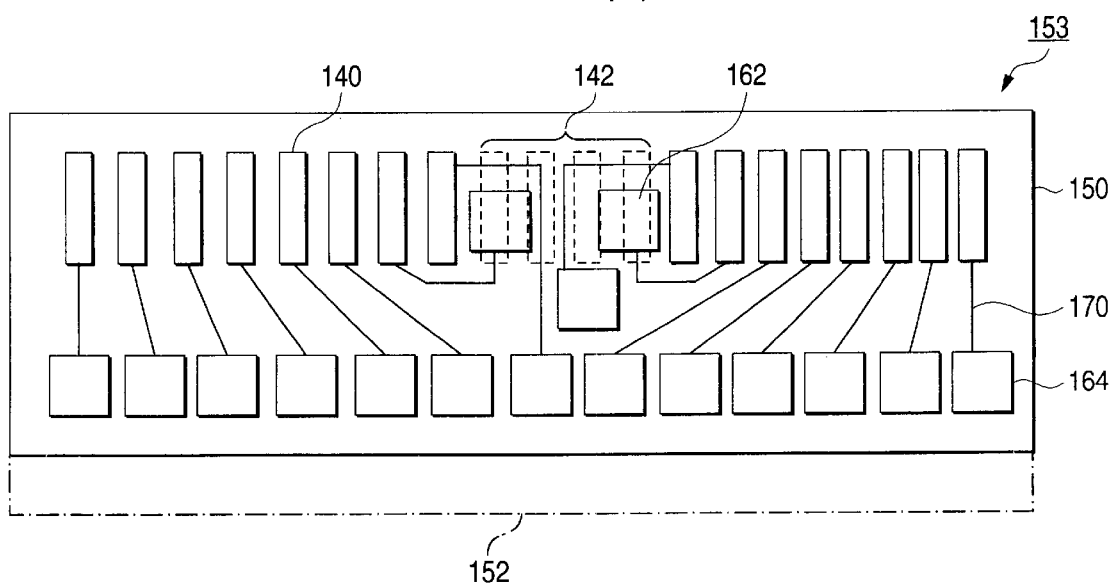
Figure 4:
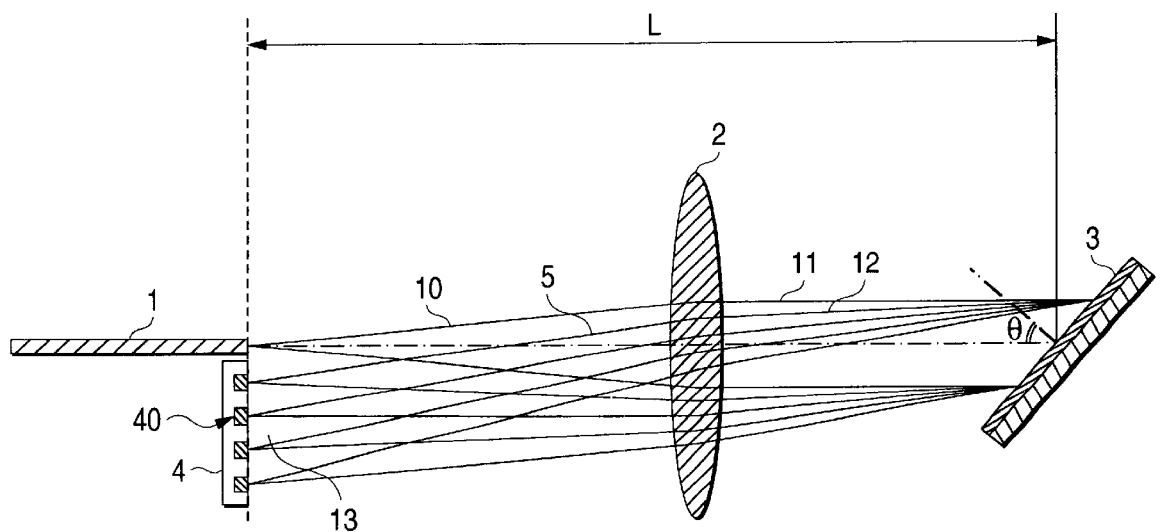
FIG. 4 is a view showing an optical system of a conventional optical communication monitor module.

While 16 continuous channels are used in the first embodiment, they may be divided into two parts, that is, 8 channels in each part for use, for example. Moreover, a frequency interval does not need to be 100 GHz. In the embodiment, an unused band for 1 THz is provided in the middle between two parts each having a frequency interval of 200 GHz (see the Table 1). In this case, a "jump" of approximately 250 μm (for four elements) is generated on the center at an interval between the photodetectors 140 as shown in the Table 1. FIG. 3(a) shows an example in which photodetectors are also formed in the jump portion to construct a photodetector array chip 152 having the same structure as that of the first embodiment. A portion surrounded by a broken line indicates an unused portion 220, and the photodetectors 140 and the bonding pads 160 in this portion are not used.

If four photodetectors (shown in a broken line) 142 are not formed as shown in FIG. 3(b), bonding pads and wirings which are annexed thereto can also be omitted. If the interval between the photodetectors 140 (i.e. the photodetector pitch) is set to approximately 50 μm in the same manner as that in the first embodiment, it is preferable that the bonding pads 160 should be arranged in two rows in the structure of FIG. 3(a). On the other hand, if the four photodetectors 142 are omitted as shown in FIG. 3(b), several bonding pads can be provided in an empty space. In the example of the arrangement shown in FIG. 3(b), bonding pads 162 for three elements are arranged in the empty space so that residual bonding pads 164 can be arranged in one row. For this reason, the area of a chip 153 can be more reduced than a chip 152 (shown in a one-dotted chain line) by 10% or more, and the size of a photodetector array chip can be reduced. The arrangement of the bonding pad shown in FIG. 3(b) is only illustrative and is not restricted thereto, and various structures can be supposed.

In the embodiment, the frequency interval is 200 GHz which is a double of that in the first embodiment. Therefore, if the interval between the photodetectors (the photodetector pitch) is approximately 50 μm in the same manner as in the first embodiment, the optical path length L may be approximately 24 mm which is approximately a half of that in the first embodiment.

In addition, in this embodiment, also, the photodetectors 140 are arrayed to accurately meet the photodetector pitch shown in table 1. However, a difference in the interval between the photodetectors (i.e. in the photodetector pitch) due to the selected wavelengths within each of divided two parts is not so large, and therefore problems rarely arise on actual working conditions even if the photodetectors 140 within each part are arrayed in an equal pitch. In addition, if the difference in the interval between the photodetectors due to the selected wavelength is great, a width of the photodetector may also be varied according to a ratio of the interval (the pitch) between the photodetectors.

In a channel monitor module using a diffraction grating, a channel can be caused to correspond to a photodetector with one to one even if a wavelength of the channel does not have an equal interval, and the structure of the module can be simplified. Moreover, the size of a photodetector array chip can be reduced.

TABLE 1

| Frequency (THz) | Wavelength (μm) | Embodiment 1 | | | | Embodiment 2 | | | |
|---|---|---|---|---|---|---|---|---|---|
| | | Channel | Wavelength Interval Δ λ i(nm) | Output angle θ oi(°) | Photodetector Pitch Pi(μm) | Channel | Wavelength Interval Δ λ i(nm) | Output Angle θ oi(°) | Photodetector Pitch Pi(μm) |
| 196.1 | 1.52877 | | | | | | | | |
| 196.0 | 1.52955 | | | | | | | | |
| 195.9 | 1.53033 | | | | | 16 | | 36.91 | |
| 195.8 | 1.53112 | | | | | | | | |
| 195.7 | 1.53190 | | | | | 15 | 1.56 | 37.02 | 48.1 |
| 195.6 | 1.53268 | | | | | | | | |
| 195.5 | 1.53347 | | | | | 14 | 1.57 | 37.14 | 48.3 |
| 195.4 | 1.53425 | | | | | | | | |
| 195.3 | 1.53504 | | | | | 13 | 1.57 | 37.25 | 48.4 |
| 195.2 | 1.53582 | | | | | | | | |
| 195.1 | 1.53661 | | | | | 12 | 1.57 | 37.37 | 48.6 |
| 195.0 | 1.53740 | | | | | | | | |
| 194.9 | 1.53819 | | | | | 11 | 1.58 | 37.48 | 48.8 |
| 194.8 | 1.53898 | | | | | | | | |
| 194.7 | 1.53977 | | | | | 10 | 1.58 | 37.60 | 49.0 |
| 194.6 | 1.54056 | | | | | | | | |
| 194.5 | 1.54135 | | | | | 9 | 1.58 | 37.71 | 49.1 |
| 194.4 | 1.54214 | | | | | | | | |
| 194.3 | 1.54294 | | | | | | (1.59) | (37.83) | (49.3) |
| 194.2 | 1.54373 | | | | | | | | |
| 194.1 | 1.54453 | | | | | | (1.59) | (37.95) | (49.5) |
| 194.0 | 1.54532 | | | | | | | | |
| 193.9 | 1.54612 | | | | | | (1.59) | (38.06) | (49.7) |
| 193.8 | 1.54692 | 16 | | 38.12 | | | | | |
| 193.7 | 1.54772 | 15 | 0.80 | 38.18 | 49.4 | | (1.60) | (38.18) | (49.9) |
| 193.6 | 1.54851 | 14 | 0.80 | 38.24 | 49.5 | | | | |
| 193.5 | 1.54932 | 13 | 0.80 | 38.30 | 49.6 | 8 | 7.97 | 38.30 | 249.2 |
| 193.4 | 1.55012 | 12 | 0.80 | 38.36 | 49.7 | | (1.60) | | (50.0) |
| 193.3 | 1.55092 | 11 | 0.80 | 38.42 | 49.8 | 7 | 1.60 | 38.42 | 50.2 |
| 193.2 | 1.55172 | 10 | 0.80 | 38.48 | 49.9 | | | | |
| 193.1 | 1.55252 | 9 | 0.80 | 38.54 | 50.0 | 6 | 1.61 | 38.54 | 50.4 |
| 193.0 | 1.55333 | 8 | 0.81 | 38.60 | 50.1 | | | | |
| 192.9 | 1.55413 | 7 | 0.81 | 38.66 | 50.2 | 5 | 1.61 | 38.66 | 50.6 |
| 192.8 | 1.55494 | 6 | 0.81 | 38.72 | 50.3 | | | | |
| 192.7 | 1.55575 | 5 | 0.81 | 38.78 | 50.4 | 4 | 1.61 | 38.78 | 50.8 |
| 192.6 | 1.55655 | 4 | 0.81 | 38.84 | 50.5 | | | | |
| 192.5 | 1.55736 | 3 | 0.81 | 38.90 | 50.6 | 3 | 1.62 | 38.90 | 51.0 |
| 192.4 | 1.55817 | 2 | 0.81 | 38.96 | 50.7 | | | | |
| 192.3 | 1.55898 | 1 | 0.81 | 39.02 | 50.8 | 2 | 1.62 | 39.02 | 51.2 |
| 192.2 | 1.55979 | | | | | | | | |
| 192.1 | 1.56061 | | | | | 1 | 1.62 | 39.14 | 51.4 |

What is claimed is:

1. An optical communication monitor module for dividing a wavelength multiplexed light having N channels (N is an integer of 3 or more) through a diffraction grating having a diffraction order of m and a grating period of d and for receiving the divided light through a photodetector array, wherein a pitch $p_i$ between i'th and (i+1)'th (i is an integer of 1 to (-1)) photodetectors in the photodetector array satisfies the following equation:

$$p_i = m \Delta \lambda_i L / d \cos \theta_o$$

$\Delta \lambda_i$ being a wavelength interval between i'th and (i+1)'th channels, L being an optical path length between the diffraction grating and the photodetector array, and $\theta_o$ being a mean output angle.

2. A module according to claim 1, wherein between respective photodetectors $p_i$ takes different values ranging between 48.1 and 249.2.

3. A module according to claim 1, wherein photodetectors are arrayed to accurately meet respective different photodetector pitches.

4. A module according to claim 1, wherein the photodetectors have a pitch difference of 2.8% between maximum and minimum values.

* * * * *